US012581790B2

(12) United States Patent
Kim et al.

(10) Patent No.: US 12,581,790 B2
(45) Date of Patent: Mar. 17, 2026

(54) ELETROLUMINESCENT DEVICE INCLUDING POLYCARBOXYLIC ACID COMPOUND AND HALOGEN AT INTERFACE BETWEEN ELECTRON TRANSPORT LAYER AND LIGHT EMITTING LAYER, AND PRODUCTION METHOD THEREOF

(71) Applicant: Samsung Electronics Co., Ltd., Suwon-si (KR)

(72) Inventors: Kwanghee Kim, Suwon-si (KR); Taehyung Kim, Suwon-si (KR); Hong Kyu Seo, Suwon-si (KR); Wonsik Yoon, Suwon-si (KR); Eun Joo Jang, Suwon-si (KR)

(73) Assignees: SAMSUNG DISPLAY CO., LTD., Gyeonggi-do (KR); SAMSUNG ELECTRONICS CO., LTD., Gyeonggi-do (KR)

( * ) Notice: Subject to any disclaimer, the term of this patent is extended or adjusted under 35 U.S.C. 154(b) by 580 days.

(21) Appl. No.: 17/966,926

(22) Filed: Oct. 17, 2022

(65) Prior Publication Data

US 2023/0121042 A1 Apr. 20, 2023

(30) Foreign Application Priority Data

Oct. 15, 2021 (KR) ........................ 10-2021-0137691

(51) Int. Cl.
*H10K 50/115* (2023.01)
*H10K 50/125* (2023.01)
(Continued)

(52) U.S. Cl.
CPC ......... *H10K 50/115* (2023.02); *H10K 50/125* (2023.02); *H10K 50/16* (2023.02); *H10K 71/00* (2023.02); *H10K 2102/101* (2023.02)

(58) Field of Classification Search
None
See application file for complete search history.

(56) References Cited

U.S. PATENT DOCUMENTS 10,113,109 B2 10/2018 Gruhlke et al.
10,340,427 B2 7/2019 Baesjou et al.
(Continued)

FOREIGN PATENT DOCUMENTS

JP 2020150251 A 9/2020
KR 20160119149 A 10/2016
(Continued)

OTHER PUBLICATIONS

Eunjoo Jang et al., "White-Light-Emitting Diodes with Quantum Dot Color Converters for Display Backlights," Adv. Mater., May 31, 2010, pp. 3076-3080, vol. 22.
(Continued)

*Primary Examiner* — Daniel Whalen
(74) *Attorney, Agent, or Firm* — CANTOR COLBURN LLP

(57) ABSTRACT

An electroluminescent device including a first electrode; a second electrode; a light emitting layer disposed between the first electrode and the second electrode; and an electron transport layer disposed between the light emitting layer and the second electrode, wherein the light emitting layer includes semiconductor nanoparticles, wherein the electron transport layer includes a plurality of metal oxide nanoparticles, and wherein the electron transport layer further includes a polycarboxylic acid compound and a halogen.

20 Claims, 6 Drawing Sheets

A: Halogen and polycarboxylic acid

(51) Int. Cl.
   *H10K 50/16*        (2023.01)
   *H10K 71/00*        (2023.01)
   *H10K 102/10*       (2023.01)

(56)                References Cited

U.S. PATENT DOCUMENTS

| | | | |
|---|---|---|---|
| 11,374,189 B2 | 6/2022 | Yajima et al. | |
| 2020/0083470 A1* | 3/2020 | Chung | H10K 50/115 |
| 2020/0411784 A1* | 12/2020 | Jang | H10K 50/115 |

FOREIGN PATENT DOCUMENTS

| | | |
|---|---|---|
| KR | 101840423 B1 | 3/2018 |
| KR | 20180106123 A | 10/2018 |
| KR | 102207330 B1 | 1/2021 |
| KR | 102226069 B1 | 3/2021 |

OTHER PUBLICATIONS

Hyungsuk Moon et al., "Stability of Quantum Dots, Quantum Dot Films, and Quantum Dot Light-Emitting Diodes for Display Applications," Adv. Mater., Jan. 16, 2019, pp. 1-14, vol. 31.

Qiang Su et al., "Enhancing the Performance of Quantum-Dot Light-Emitting Diodes by Postmetallization Annealing," ACS Appl. Mater. Interfaces, Jun. 19, 2018, pp. 23218-23224, vol. 10.

Rabindra Nath Juine et al., "Surfactant-Free Green Synthesis of ZnS QDs with Active Surface Defects for Selective Nanomolar Oxalic Acid Colorimetric Sensors at Room Temperature," ACS Sustainable Chem. Eng., Jul. 16, 2020, pp. 11579-11587, vol. 8.

Ruili Wang et al., "Colloidal quantum dot ligand engineering for high performance solar cells," Energy & Environmental Science, Mar. 10, 2016, pp. 1130-1143, vol. 9.

Seth Coe et al., "Electroluminescence from single monolayers of nanocrystals in molecular organic devices," Nature, Dec. 2002, pp. 800-803, vol. 420.

Shadpour Mallakpour et al., "Effects of citric acid-functionalized ZnO nanoparticles on the structural, mechanical, thermal and optical properties of polycaprolactone nanocomposite films," Materials Chemistry and Physics, May 16, 2017, pp. 129-137, vol. 197.

Tae-Ho Kim et al., "Full-colour quantum dot displays fabricated by transfer printing," Nature Photonics, Mar. 2011, pp. 176-182, vol. 5.

Mzhe Sun et al., "Efficient quantum dot light-emitting diodes with a Zn0.85Mg0.15O interfacial modification layer," Nanoscale, Jul. 14, 2017, pp. 8893-9248, vol. 9, No. 26.

Yizhe Sun et al., "Efficient quantum dot light-emitting diodes with a Zn0.85Mg0.15O interfacial modification layer," Nanoscale, Jul. 14, 2017, pp. 8962-8969, vol. 9, No. 26.

* cited by examiner

A:  Halogen and polycarboxylic acid

A: Halogen

ELETROLUMINESCENT DEVICE INCLUDING POLYCARBOXYLIC ACID COMPOUND AND HALOGEN AT INTERFACE BETWEEN ELECTRON TRANSPORT LAYER AND LIGHT EMITTING LAYER, AND PRODUCTION METHOD THEREOF

CROSS-REFERENCE TO RELATED APPLICATION

This application claims priority to Korean Patent Application No. 10-2021-0137691 filed in the Korean Intellectual Property Office on Oct. 15, 2021, and all the benefits accruing therefrom under 35 U.S.C. § 119, the content of which in its entirety is herein incorporated by reference.

BACKGROUND

1. Field

The present disclosure relates to semiconductor nanoparticles and a device including the same.

2. Description of the Related Art

A semiconductor nanoparticle (e.g., a semiconductor nanocrystal particle) having a nanometer size may emit light. For example, a semiconductor nanoparticle including a semiconductor nanocrystal may exhibit a quantum confinement effect, and thereby, demonstrate luminance properties. For example, light emission from the semiconductor nanoparticle may occur when an electron in an excited state resulting from light excitation or an applied voltage transitions from a conduction band to a valence band. The semiconductor particle may be configured to emit light of a desired wavelength region by adjusting a size of the semiconductor nanoparticle, a composition of the semiconductor nanoparticle, or a combination thereof.

Semiconductor nanoparticles may be used in, for example, an electroluminescent device (e.g., an electroluminescent light emitting device) or a display device.

SUMMARY

An embodiment provides a luminescent device that emits light, for example, by applying a voltage to nanostructures (e.g., nanoparticles such as semiconductor nanoparticles).

An embodiment provides a display device (e.g., a quantum dot (QD)-light emitting diode (LED) display) that includes a light emitting material having nanostructures (e.g., nanoparticle such as semiconductor nanoparticle) in a configuration of a blue pixel, a red pixel, a green pixel, or a combination thereof.

In an embodiment, an electroluminescent device includes: a first electrode and a second electrode spaced apart from each other (e.g., each electrode having a surface opposite the other), and a light emitting layer disposed between the first electrode and the second electrode, and an electron transport layer disposed between the light emitting layer and the second electrode, wherein the light emitting layer includes a plurality of semiconductor nanoparticles, wherein the electron transport layer includes a plurality of metal oxide nanoparticles, and wherein the electron transport layer further includes a polycarboxylic acid compound and a halogen.

The electroluminescent device may be configured to emit green light as a voltage is applied thereon.

The electroluminescent device may be configured to emit blue light as a voltage is applied thereon.

The electroluminescent device may be configured to emit red light as a voltage is applied thereon.

In an embodiment, the semiconductor nanoparticles may not include cadmium, lead, mercury, or a combination thereof.

The electroluminescent device may further include a hole auxiliary layer between the light emitting layer and the first electrode. The hole auxiliary layer may include a hole transport layer (e.g., including an organic compound), a hole injection layer, or a combination thereof.

The plurality of semiconductor nanoparticles may include a first semiconductor nanocrystal including zinc, selenium, and tellurium, and a second semiconductor nanocrystal including a zinc chalcogenide and being different from the first semiconductor nanocrystal.

The plurality of semiconductor nanoparticles may include a first semiconductor nanocrystal including indium, phosphorus, and optionally zinc and a second semiconductor nanocrystal including a zinc chalcogenide and different from the first semiconductor nanocrystal.

An average size of the plurality of the semiconductor nanoparticles may be greater than or equal to about 4 nanometers (nm), greater than or equal to about 5 nm, greater than or equal to about 7 nm, greater than or equal to about 8 nm, greater than or equal to about 9 nm, or greater than or equal to about 10 nm. An average size of the plurality of semiconductor nanoparticles may be less than or equal to about 30 nm, less than or equal to about 20 nm, less than or equal to about 15 nm, less than or equal to about 12 nm, or less than or equal to about 10 nm.

The plurality of semiconductor nanoparticles may include a core including the first semiconductor nanocrystal and a shell disposed on the core and including the second semiconductor nanocrystal.

The electron transport layer may be adjacent to (or disposed directly on) the light emitting layer.

The polycarboxylic acid compound may be present at an interface between the electron transport layer and the light emitting layer.

The polycarboxylic acid compound may have a carbon number of greater than or equal to about 2 and less than or equal to about 150, or less than or equal to about 15.

The polycarboxylic acid may be a compound having 2 to 10 carboxylic acid groups.

An acid dissociation constant of the polycarboxylic acid compound may be greater than or equal to about 2 and less than or equal to about 10.

The polycarboxylic acid compound may include succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof.

The halogen may include fluorine, chlorine, bromine, iodine, or a combination thereof.

The halogen may be included in a form of a metal halide, a halogen containing an onium salt compound (e.g., an oxonium compound including a halogen), or a combination thereof.

The metal oxide may include a zinc oxide.

The zinc oxide may include an additional metal comprising Mg, Ca, Zr, W, Li, Ti, Y, Al, or a combination thereof.

The zinc oxide nanoparticles may include a compound represented by $Zn_{1-x}M_xO$, wherein, M is Mg, Ca, Zr, Co, W, Li, Ti, Y, Al, or a combination thereof, and $0 \leq x \leq 0.5$. The x may be greater than or equal to about 0.01, greater than or equal to about 0.03, greater than or equal to about 0.05, greater than or equal to about 0.1, or greater than or equal to about 0.15. The x may be less than or equal to about 0.45, or less than or equal to about 0.4. An average size of the zinc oxide nanoparticles may be greater than or equal to about 1 nm, or greater than or equal to about 3 nm. An average size of the zinc oxide nanoparticles may be less than or equal to about 10 nm, or less than or equal to about 8 nm.

The plurality of the semiconductor nanoparticles may include zinc and in the light emitting layer, a mole ratio of halogen to zinc may be greater than or equal to about 0.01:1, greater than or equal to about 0.015:1, or greater than or equal to about 0.02:1, and less than or equal to about 0.5:1, or less than or equal to about 0.05:1.

The light emitting layer may exhibit a porosity of greater than or equal to about 0.01%, greater than or equal to about 0.1%, greater than or equal to about 0.5% and less than or equal to about 5%, less than or equal to about 2.5%, less than or equal to about 2%.

The electroluminescent device may exhibit a maximum external quantum efficiency of greater than or equal to about 6%, greater than or equal to about 7%, greater than or equal to about 8%, greater than or equal to about 9%, greater than or equal to about 10%, greater than or equal to about 11%, greater than or equal to about 12%, greater than or equal to about 13%, or greater than or equal to about 14%, and less than or equal to about 40%.

A brightness of the electroluminescent device may decrease to 90% of an initial brightness of the electroluminescent device after greater than or equal to about 7.6 hours.

The electroluminescent device may exhibit a maximum luminance of greater than or equal to about 60,000 nit (candelas per square meter or $cd/m^2$), greater than or equal to about 70,000 nit and less than or equal to about 1,000,000 nit.

In an embodiment, a display device or an electronic device may include the electroluminescent device.

The display device or an electronic device may include (or may be) a handheld terminal, a monitor, a notebook computer, a television, an electronic display board, a camera, a part for an automatic vehicle.

In an embodiment, a method of producing the electronic device includes:

forming the light emitting layer on the first electrode, applying a treating solution on the light emitting layer, wherein the treating solution includes the polycarboxylic acid compound and the halogen in a first organic solvent, heat-treating the light emitting layer to which the treating solution has been applied at a temperature of greater than or equal to about 80° C., greater than or equal to about 100° C., and less than or equal to about 250° C., and forming the electron transport layer on the heat-treated light emitting layer to produce the electroluminescent device.

The method may further include washing the light emitting layer to which the treating solution has been applied with a second organic solvent prior to the heat-treating.

The first organic solvent, the second organic solvent, or a combination thereof may include a $C_{1-10}$ alcohol solvent, a $C_{2-20}$ nitrile solvent (e.g., RCN, wherein R is a substituted or unsubstituted C1 to C19 hydrocarbon), a $C_{3-50}$ ester solvent (e.g., RCOOR, wherein each R is independently a substituted or unsubstituted C1 to C19 hydrocarbon) or a combination thereof.

The organic solvent may include ethanol, methanol, propanol, acetonitrile, ethyl acetate, or a combination thereof. The polycarboxylic acid compound may include a $C_{2-15}$ polycarboxylic acid compound having two to ten carboxylic acid groups.

The halogen compound may include a metal halide, an onium salt compound, or a combination thereof.

The polycarboxylic acid compound may include succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof.

The halogen compound may include a zinc halide, a trialkyl oxonium haloborate compound, or a combination thereof.

In an embodiment, an electroluminescent device including a first electrode and a second electrode spaced apart from each other (e.g., each electrode having a surface opposite the other), and a light emitting layer disposed between the first electrode and the second electrode, and an electron transport layer disposed between the light emitting layer and the second electrode, wherein the device or light emitting layer is configured to emit blue light and includes a plurality of semiconductor nanoparticles and, wherein the plurality of semiconductor nanoparticles may include (a zinc chalcogenide including) zinc, selenium, and sulfur, and optionally further include tellurium, and the electron transport layer includes a plurality of zinc oxide nanoparticles, and the light emitting layer further includes halogen, wherein in the light emitting layer, a mole ratio of halogen to zinc is greater than or equal to about 0.01:1 (or greater than or equal to about 0.02:1) and less than or equal to about 0.5:1, and the light emitting layer exhibits a porosity of greater than or equal to about 0.1%, or greater than or equal to about 0.5% and less than or equal to about 5%, or less than or equal to about 2.5%, or less than or equal to about 2%.

In the electroluminescent device of an embodiment, the light emitting layer may further include a polycarboxylic acid compound.

The polycarboxylic acid compound may include succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof.

In an embodiment, semiconductor nanoparticles include zinc, selenium, sulfur, and a compound bound to a surface of at least a portion of the semiconductor nanoparticles, wherein the compound includes a polycarboxylic acid compound, and a halogen. The halogen be derived from or present in a form of a metal halide, an onium salt compound comprising a halogen, or a combination thereof.

According to an embodiment, the electroluminescent device may exhibit both increased electroluminescent properties and a desired or improved lifespan. According to an embodiment, the electroluminescent device may include a light emitting layer showing, e.g., exhibiting, an improved surface quality, including an interface passivation between the light emitting layer and the electron transport layer, and a greater, e.g., increased, lifespan at a relatively increased external quantum efficiency.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
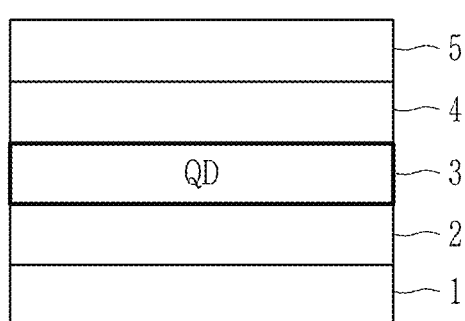
FIG. 1 is a schematic cross-sectional view of a light-emitting device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification.

The size and thickness of each constituent element as shown in the drawings are indicated for better understanding and ease of description, and this disclosure is not necessarily limited to sizes or thicknesses as shown. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, the term "cross-sectional phase" means a case in which a cross-section of a given object is cut, for example, in a substantially vertical direction and is viewed laterally.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Hereinafter, values of a work function, a conduction band, or a lowest unoccupied molecular orbital (LUMO) (or valence band or highest occupied molecular orbital (HOMO)) energy level is expressed as an absolute value from a vacuum level. In addition, when the work function or the energy level is referred to be "deep," "high" or "large," the work function or the energy level has a large absolute value based on "0 electronvolts (eV)" of the vacuum level, while when the work function or the energy level is referred to be "shallow," "low," or "small," the work function or energy level has a small absolute value based on "0 eV" of the vacuum level.

As used herein, the term "Group" may refer to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and Tl, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, "metal" includes a semi-metal such as Si.

As used herein, the average (value) may be mean or median. In an embodiment, the average (value) may be a mean average.

As used herein, a number of carbon atoms in a group or a molecule may be referred to as a subscript (e.g., $C_{6-50}$) or as C6 to C50.

As used herein, when a definition is not otherwise provided, "substituted" refers to replacement of a, e.g., at least one, hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a $C_1$ to $C_6$ alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hydrocarbon" or "hydrocarbon group" refers to a compound or a group including carbon and hydrogen (e.g., alkyl, alkenyl, alkynyl, or aryl group). The hydrocarbon group may be a monovalent group or a group having a valence of greater than one formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

In an embodiment, "monovalent organic functional group" for example, "monovalent organic acids," may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, "alkyl" refers to a linear or branched saturated monovalent hydrocarbon group (methyl, ethyl hexyl, etc.). In an embodiment, an alkyl group may have from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a carbon-carbon double bond. In an embodiment, an alkenyl group may have from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a carbon-carbon triple bond. In an embodiment, an alkenyl group may have from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an arene (e.g., a phenyl or naphthyl group). In an embodiment, an aryl group may have from 6 to 50 carbon atoms, or 6 to 18 carbon atoms, or 6 to 12 carbon atoms. As used herein, when a definition is not otherwise provided, "hetero" refers to inclusion of 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" or "amine group" is a group represented by —NRR, wherein each R is independently hydrogen, a C1-C12 alkyl group, a C7-C20 alkylarylene group, a C7-C20 arylalkylene group, or a C6-C18 aryl group.

In an embodiment, "alkylene group" may refer to a straight or branched saturated aliphatic hydrocarbon group having at least two valences and optionally substituted with a, e.g., at least one, substituent.

In an embodiment, "arylene group" may refer to a functional group having at least two valences obtained by removal of at least two hydrogens in an, e.g., at least one, aromatic ring, and optionally substituted with a, e.g., at least one, substituent.

In an embodiment, "aliphatic group" or "aliphatic hydrocarbon" may refer to a saturated or unsaturated linear or branched C1 to C30 group consisting of carbon and hydrogen.

In an embodiment, "aromatic" or "aromatic organic group" may include a C6 to C30 aryl group or a C2 to C30 heteroaryl group, and "alicyclic group" refers to a saturated or unsaturated C3 to C30 cyclic group consisting of carbon and hydrogen.

As used herein, "poly(meth)acrylic" refers to a polyacrylic, a polymethacrylic, or a combination thereof.

In an embodiment, "chalcogen" is inclusive of sulfur(S), selenium (Se), and tellurium (Te). In an embodiment, "chalcogen" may include or may not include oxygen (O).

As used herein, the expression "not including cadmium (or other harmful heavy metal)" may refer to the case in which a concentration of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other toxic heavy toxic metal) may be present or, if present, an amount of cadmium (or other heavy metal) may be less than or equal to a detection limit or as an impurity level of a given analysis tool (e.g., an inductively coupled plasma atomic emission spectroscopy instrument).

Unless mentioned to the contrary, a numerical range recited herein is inclusive. Unless mentioned to the contrary, a numerical range recited herein includes any real number within the endpoints of the stated range and includes the endpoints thereof.

As used herein, the upper and lower endpoints set forth for various numerical values may be independently combined to provide a range.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3%, or ±1% of the stated value.

As used herein, a nanostructure or a nanoparticle is a structure having a, e.g., at least one, region or characteristic dimension with a dimension of less than or equal to about 500 nm. In an embodiment, a dimension (or an average) of the nanostructure is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any suitable shape. The nanostructure may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanostructure or the nanoparticle can be, e.g., substantially crystalline, substantially monocrystalline, polycrystalline, (for example, at least partially) amorphous, or a combination thereof.

In an embodiment, a semiconductor nanoparticle or a semiconductor nanostructure may exhibit quantum confinement or exciton confinement. As used herein, the term "semiconductor nanoparticle" or "semiconductor nanostructure" is not limited in a shape thereof unless otherwise defined. A semiconductor nanoparticle or a semiconductor nanostructure may have a size smaller than a Bohr excitation diameter for a bulk crystal material having an identical composition and may exhibit a quantum confinement effect. The semiconductor nanoparticle or the semiconductor nanostructure may emit light corresponding to a bandgap energy thereof by controlling a size of a nanocrystal acting as an emission center.

As used herein, the term "T50" is a time (hours (hr)) the brightness (e.g., luminance) of a given device decreases to 50% of the initial brightness (100%) as, e.g., when, the given device is driven, e.g., operated, at a predetermined brightness (e.g., 650 nit).

As used herein, the term "T90" is a time (hr) the brightness (e.g., luminance) of a given device decreases to 90% of the initial brightness (100%) as the given device is driven at a predetermined brightness (e.g., 650 nit).

As used herein, the phrase "external quantum efficiency (EQE)" is a ratio of the number of photons emitted from a light emitting diode (LED) to the number of electrons passing through the device, and can be a measurement as to how efficiently a given device converts electrons to photons and allows the photons to escape. The EQE can be determined by the following equation:

$$EQE = \text{an efficiency of injection} \times \text{a (solid-state) quantum yield} \times \text{an efficiency of extraction.}$$

wherein the efficiency of injection is a proportion of electrons passing through the device that are injected into the active region, the quantum yield is a proportion of all electron-hole recombination in the active region that are radiative and produce photons, the efficiency of extraction is a proportion of photons generated in the active region that escape from the given device.

As used herein, a maximum EQE is a greatest value of the EQE.

As used herein, a maximum luminance is a greatest value of the luminance a given device can achieve.

As used herein, the phrase quantum efficiency may be used interchangeably with the phrase quantum yield. In an embodiment, the quantum efficiency may be a relative quantum yield or an absolute quantum yield, for example, which can be readily measured by any suitable, e.g., commercially available, equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths thereof, but are not limited thereto.

A bandgap energy of a semiconductor nanoparticle may vary with a size and a composition of a nanocrystal. For example, as a size of the semiconductor nanoparticle increases, the bandgap energy of the semiconductor nanoparticle may become smaller, e.g., narrower, and the semiconductor nanoparticle may emit light of, e.g., having an, increased emission wavelength. A semiconductor nanocrystal may be used as a light emitting material in various fields of, e.g., such as in, a display device, an energy device, or a bio light emitting device.

A semiconductor nanoparticle electroluminescent device (hereinafter, also referred to as a QD-LED) may emit light by applying a voltage and includes a semiconductor nanoparticle as a light emitting material. A QD-LED, which uses a different emission principle from an organic light emitting diode (OLED) using organic materials and realizes, e.g., displays or exhibits, more pure, e.g., higher purity, colors (e.g., red, green, and blue) and improved color reproducibility, may be a next generation display device. A method of producing a QD-LED may include a solution process, which may lower, e.g., reduce, a manufacturing cost. In addition, semiconductor nanoparticles in a QD-LED may be based on an inorganic material, contributing to realization of increased stability. It is still desired to develop a technology improving a performance and a lifespan of a device.

Semiconductor nanoparticles exhibiting a desirable electroluminescent property may contain a harmful heavy metal such as cadmium (Cd), lead, mercury, or a combination thereof. Accordingly, it is desirable to provide an electroluminescent device or a display device having a light emitting layer substantially free of a harmful heavy metal.

In an embodiment, an electroluminescent device may be a luminescent type of electroluminescent device configured to emit a desired light by applying a voltage.

In an embodiment, an electroluminescent device includes a first electrode 1 and a second electrode 5 spaced apart each other (e.g., each having a surface opposite the other, i.e., each with a surface facing each other); and a light emitting layer 3 disposed between the first electrode 1 and the second electrode 5, and an electron transport layer 4 disposed between the light emitting layer 3 and the second electrode 5. In an embodiment, the electroluminescent device may further include a hole auxiliary layer 2 between the light emitting layer and the first electrode. The hole auxiliary layer may include a hole transport layer including an organic compound, a hole injection layer, or a combination thereof. See FIG. 1.

Figure 2:
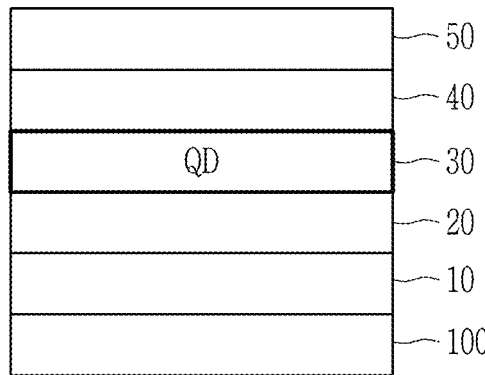
FIG. 2 is a schematic cross-sectional view of a light-emitting device according to an embodiment.
Figure 3:
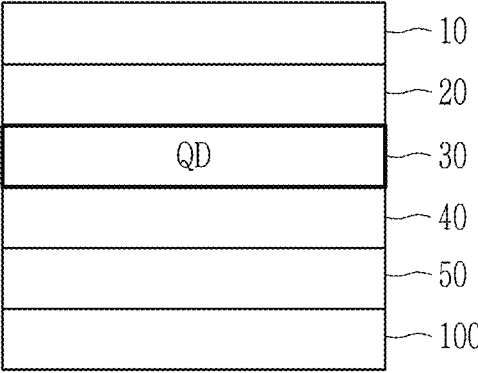
FIG. 3 is a schematic cross-sectional view of a light-emitting device according to an embodiment.

The first electrode may include an anode, and the second electrode may include a cathode. The first electrode may include a cathode and the second electrode may include an anode. In the electroluminescent device of an embodiment, the first electrode 10 or the second electrode 20 may be disposed on a (transparent) substrate. The transparent substrate may be a light extraction surface as depicted in FIG. 2 and FIG. 3. The light emitting layer may be disposed in a pixel of a display device described herein.

Referring to FIGS. 2 and 3, in an electroluminescent device of an embodiment, a light emitting layer 30 may be disposed between a first electrode (e.g., anode) 10 and a second electrode (e.g., cathode) 50. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) (e.g., aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The first electrode, the second electrode, or a combination thereof may be patterned electrodes. The first electrode, the second electrode, or a combination thereof may be disposed on a (e.g., insulating) substrate 100. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and, for example, less than or equal to about 99%, or less than or equal to about 95%). The substrate 100 may include a region for a blue pixel, a region for a red pixel, a region for a green pixel, or a combination thereof. A thin film transistor may be disposed in each region of the substrate, and a source electrode or a drain electrode of the thin film transistor may be electrically connected to the first electrode or the second electrode.

The light-transmitting electrode may be disposed on a (e.g., insulating) transparent substrate. The substrate 100 may be a rigid or a flexible substrate. The substrate 100 may include a plastic or organic material such as a polymer, an inorganic material such as a glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg: Ag, or the like, or a thin metal thin film of a single layer or a plurality of layers, but is not limited thereto. If one of the first electrode or the second electrode is an opaque electrode, the opaque electrode may be made of an opaque conductor such as aluminum (Al), a lithium-aluminum (Li:Al) alloy, a magnesium-silver (Mg:Ag) alloy, and lithium fluoride-aluminum (LiF:Al).

The thickness of each electrode (the first electrode, the second electrode, or a combination thereof) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers ($\mu$m), less than or equal to about 90 $\mu$m, less than or equal to about 80 $\mu$m, less than or equal to about 70 $\mu$m, less than or equal to about 60 $\mu$m, less than or equal to about 50 $\mu$m, less than or equal to about 40 $\mu$m, less than or equal to about 30 $\mu$m, less than or equal to about 20 $\mu$m, less than or equal to about 10 $\mu$m, less than or equal to about 1 $\mu$m, less than or equal to about 900 nm, less than or equal to about 500 nm, or less than or equal to about 100 nm.

The light emitting layer 30 disposed between the first electrode and the second electrode (e.g., the anode 10 and the cathode 50) may include a plurality of semiconductor nanoparticles (e.g., blue light emitting nanoparticles, red light emitting nanoparticles, green light emitting nanoparticles, or a combination thereof). In an embodiment, the semiconductor nanoparticles may not comprise cadmium. The light emitting layer may include one or more (e.g., 2 or more or 3 or more and 10 or less) monolayers of a plurality of nanoparticles.

The light emitting layer may be patterned. In an embodiment, the patterned light emitting layer may include a blue light emitting layer disposed in the blue pixel. In an embodiment, the light emitting layer may further include a red light emitting layer disposed in the red pixel or a green light emitting layer disposed in the green pixel. In an embodiment, the light emitting layer may include a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices may be disposed between the red light emitting layer, the green light emitting layer, and the blue light emitting layer. The red light emitting layer, the green light emitting layer, and the blue light emitting layer may be optically isolated from each other.

In an embodiment, the light emitting layer or the semiconductor nanoparticle may not include cadmium. In an embodiment, the light emitting layer or the semiconductor nanoparticle may not include mercury, lead, or a combination thereof.

In an embodiment, the semiconductor nanoparticle may have a core-shell structure. In an embodiment, the semiconductor nanoparticle or the core-shell structure may include a core including a first semiconductor nanocrystal and a shell including a second semiconductor nanocrystal disposed on the core and having a composition different from that of the first semiconductor nanocrystal.

The semiconductor nanoparticle (or the first semiconductor nanocrystal, the second semiconductor nanocrystal, or a combination thereof) may include a Group II-VI compound, a Group III-V compound, a Group IV-VI compound, a Group IV element or compound, a Group I-III-VI compound, a Group II-III-VI compound, a Group I-II-IV-VI compound, or a combination thereof. In an embodiment, the light emitting layer or the semiconductor nanoparticle (e.g., the first semiconductor nanocrystal or the second semiconductor nanocrystal) may not include cadmium. In an embodiment, the light emitting layer or the semiconductor nanoparticle (e.g., the first semiconductor nanocrystal or the second semiconductor nanocrystal) may not include lead. In an embodiment, the light emitting layer or the semiconductor nanoparticle (e.g., the first semiconductor nanocrystal or the second semiconductor nanocrystal) may not include a combination of lead and cadmium.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZnSTe, or a combination thereof; or a combination thereof. The Group II-VI compound may further include a Group Ill metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

Examples of the Group I-III-VI compound may be CuInSe$_2$, CuInS$_2$, CuInGaSe, and CuInGaS, but are not limited thereto.

Examples of the Group I-II-IV-VI compound may be CuZnSnSe, and CuZnSnS, but are not limited thereto.

The Group IV element or compound may include a single-element compound such as Si, Ge, or a combination thereof; a binary element compound such as SiC, SiGe, or a combination thereof; or a combination thereof.

In an embodiment, the semiconductor nanoparticle or the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof, and a non-metal including phosphorus, selenium, tellurium, sulfur, or a combination thereof.

In an embodiment, a first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof. In an embodiment, the shell may include zinc, sulfur, and optionally selenium in the outermost layer.

In an embodiment, the semiconductor nanoparticle may emit blue or green light and may include a core including ZnSeTe, ZnSe, or a combination thereof and a shell including a zinc chalcogenide (e.g., ZnS, ZnSe, ZnSeS, or a combination thereof). An amount of sulfur in the shell may increase or decrease in a radial direction (from the core toward the surface), e.g., the amount of sulfur may have a concentration gradient wherein the concentration of sulfur varies radially (e.g., decreases or increases in a direction toward the core).

In an embodiment, the semiconductor nanoparticle may emit red or green light, the core may include InP, InZnP, or a combination thereof, and the shell may include a Group II metal including zinc and a non-metal including sulfur, selenium, or a combination thereof.

In an embodiment, as the semiconductor nanoparticle has a core-shell structure, on the interface between the core and the shell, an alloyed interlayer may be present or may not be present. The alloyed layer may include a homogeneous alloy or may have a concentration gradient. The gradient alloy may have a concentration gradient wherein the concentration of an element of the shell varies radially (e.g., decreases or increases in a direction toward the core).

In an embodiment, the shell may have a composition that varies in a radial direction. In an embodiment, the shell may be a multilayered shell including two or more layers. In a multilayered shell, adjacent two layers may have different compositions from each other. In a multilayered shell, a, e.g., at least one, layer may independently include a semiconductor nanocrystal having a single composition. In a multilayered shell, a, e.g., at least one, layer may independently have an alloyed semiconductor nanocrystal. In a multilayered shell, a, e.g., at least one, layer may have a concentration gradient that varies radially in terms of a composition of a semiconductor nanocrystal.

In an embodiment, in a semiconductor nanoparticle having a core-shell structure, a shell material may have a bandgap energy that is larger, e.g., greater, than that of the core. The materials of the shell may have a bandgap energy that is smaller, e.g., less, than that of the core. In the case of a multilayered shell, the bandgap energy of the outermost layer material of the shell may be greater than the bandgap energies of the core and the inner layer material of the shell (layers that are closer to the core). In the case of a multilayered shell, a semiconductor nanocrystal of each layer is selected to have an appropriate bandgap, thereby effectively showing, e.g., exhibiting, a quantum confinement effect.

The semiconductor nanoparticle according to an embodiment may include, for example, an organic ligand which is bonded or coordinated to a surface thereof.

An absorption/emission wavelength of the semiconductor nanoparticle may be controlled by adjusting the compositions, sizes, or a combination thereof of the semiconductor nanoparticle. The semiconductor nanoparticle included in the light emitting layer 3 or 30 may be configured to emit light of a desired color. The semiconductor nanoparticle may include a blue light emitting semiconductor nanoparticle, a green light emitting semiconductor nanoparticle, or a red light emitting semiconductor nanoparticle.

In an embodiment, a maximum luminescent peak wavelength of the semiconductor nanoparticle may be in a wavelength range of from ultraviolet to infrared. In an embodiment, a maximum luminescent peak wavelength of the semiconductor nanoparticle may be greater than or equal to about 300 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum luminescent peak wavelength of the semiconductor nanoparticle may be less than or equal to about 800 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum luminescent peak wavelength of the semiconductor nanoparticle may be from about 500 nm to about 650 nm.

The semiconductor nanoparticle may emit green light (for example, on an application of a voltage or irradiation with light) and a maximum luminescent peak wavelength thereof may be in the range of greater than or equal to about 500 nm (for example, greater than or equal to about 510 nm, or greater than or equal to about 515 nm) and less than or equal to about 560 nm, for example, less than or equal to about 540 nm, or less than or equal to about 530 nm. The semiconductor nanoparticle may emit red light, (for example, on an application of voltage or irradiation with light), and a maximum luminescent peak wavelength thereof may be in the range of greater than or equal to about 600 nm, for example, greater than or equal to about 610 nm and less than or equal to about 650 nm, or less than or equal to about 640 nm. The semiconductor nanoparticle may emit blue light, (for example, on an application of voltage or irradiation with light) and a maximum luminescent peak wavelength thereof may be greater than or equal to about 430 nm (for example, greater than or equal to about 450 nm) and less than or equal to about 480 nm (for example, less than or equal to about 465 nm).

In an embodiment, the semiconductor nanoparticle may exhibit a luminescent spectrum (e.g., photo- or electroluminescent spectrum) with a relatively narrow full width at half maximum. In an embodiment, in the photo- or electroluminescent spectrum, the semiconductor nanoparticle may exhibit a full width at half maximum of less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm.

The full width at half maximum may be greater than or equal to about 12 nm, greater than or equal to about 20 nm, greater than or equal to about 25 nm, or greater than or equal to about 26 nm.

The semiconductor nanoparticle may exhibit (or may be configured to exhibit) a quantum efficiency (or quantum yield) of greater than or equal to about 10%, for example, greater than or equal to about 30%, greater than or equal to about 50%, greater than or equal to about 60%, greater than or equal to about 70%, greater than or equal to about 90%, or about 100%.

The semiconductor nanoparticle may have a size (or an average size, hereinafter, can be simply referred to as "size") of greater than or equal to about 1 nm and less than or equal to about 100 nm. The size may be a diameter or equivalent diameter converted by assuming a spherical shape from an electron microscope image when not spherical. The size may be calculated from a result of an inductively coupled plasma atomic emission spectroscopy (ICP-AES) analysis. In an embodiment, the semiconductor nanoparticle may have a size of from about 1 nm to about 50 nm, for example, from about 2 nm (or about 3 nm) to about 35 nm. In an embodiment, a size (or an average size) of the semiconductor nanoparticle may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an embodiment, a size (or an average size) of the semiconductor nanoparticle may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm.

The shape of the semiconductor nanoparticle or the semiconductor nanostructure is not particularly limited. For example, the shape of the semiconductor nanoparticle may include, but is not limited to, a sphere, a polyhedron, a pyramid, a multi-pod shape, a hexahedron, a cube, a cuboid, a nanotube, a nanorod, a nanowire, a nanosheet, or a combination thereof.

The semiconductor nanoparticle may be prepared in an appropriate method. The semiconductor nanoparticle may be prepared for example by a chemical wet method wherein a nanocrystal particle may grow by a reaction between precursors in a reaction system including an organic solvent and an organic ligand. The organic ligand or the organic solvent may coordinate (with or to) a surface of the semiconductor nanocrystal to control the growth thereof.

In an embodiment, for example, the method of preparing the semiconductor nanoparticle having a core/shell structure may include obtaining the core; reacting a first shell precursor including a metal (e.g., zinc) and a second shell precursor including a non-metal element (e.g., selenium, sulfur, or a combination thereof) in the presence of the core in a reaction medium including an organic ligand and an organic solvent at a reaction temperature (e.g., of greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C.) to form a shell including a second semiconductor nanocrystal on a core including a first semiconductor nanocrystal. The method may further include separating a core from a reaction system producing the same and dispersing the core in an organic solvent to obtain a core solution.

In an embodiment, in order to form the shell, a solvent and optionally, the first shell precursor and a ligand compound may be heated at a predetermined temperature (e.g., greater than or equal to about 100° C.) under vacuum (also referred to herein as vacuum-treated) and then, after introducing an inert gas into the reaction vessel, the mixture may be heat-treated again at a predetermined temperature (e.g., greater than or equal to about 100° C.). Then, the core and the second shell precursor may be added to the mixture and heated at a reaction temperature. The shell precursors may be added at different ratios during a reaction time simultaneously or sequentially.

In the semiconductor nanoparticle of an embodiment, the core may be prepared in an appropriate manner. In an embodiment, the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a (e.g., 1, 2, or 3) C6 to C22 alkyl group, a C12 to C22 aromatic ether such as phenyl ether or benzyl ether, or a combination thereof. A combination including more than one type of organic solvent may be used, The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $R_2POOH$ or a combination thereof. Herein, R and R' are each independently a substituted or unsubstituted, C3 or greater, C6 or greater, or C10 or greater and about C40 or less, C35 or less, or C25 or less, aliphatic hydrocarbon group (e.g., alkyl, alkenyl, alkynyl, etc.), a substituted or unsubstituted C6 to C40 aromatic hydrocarbon group (e.g., aryl group), or a combination thereof. In an embodiment, at least two different organic ligand may be used.

In an embodiment, after completing the reaction (for the formation of the core or for the formation of the shell), a nonsolvent is added to reaction products and nanoparticle coordinated with the ligand compound may be separated. The nonsolvent may be a polar solvent that is miscible with the solvent used in the core formation reactions, shell formation reaction, or a combination thereof and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, or chromatography. The separated nanocrystals may be washed with a washing solvent, if desired. The washing solvent has no particular limit and may have a similar solubility parameter to that of the ligand and may, for example, include hexane, heptane, octane, chloroform, toluene, benzene, and the like.

The semiconductor nanoparticles of an embodiment may be non-dispersible or water-insoluble in water, the aforementioned nonsolvent, or a combination thereof. The semiconductor nanoparticles of an embodiment may be dispersed in the aforementioned organic solvent. In an embodiment, the aforementioned semiconductor nanoparticles may be dispersed in a C6 to C40 aliphatic hydrocarbon, a substituted or unsubstituted C6 to C40 aromatic hydrocarbon, or a combination thereof.

The prepared semiconductor nanoparticles may be surface-treated with a halogen compound. By the surface-treatment with the halogen compound, at least a portion of the organic ligand may be replaced with the halogen. The halogen treated semiconductor nanoparticles may include a reduced amount of the organic ligand. The halogen treatment may be carried out contacting the semiconductor nanoparticles with the halogen compound (e.g., a metal halide such as a zinc chloride) at a predetermined temperature of from about 30° C. to about 100° C. or from about 50° C. to about 150° C. in an organic solvent.

In the electroluminescent device, a thickness of the light emitting layer may be appropriately selected. In an embodiment, the light emitting layer may include a monolayer of nanoparticles. In an embodiment, the light emitting layer may include one or more, for example, two or more, three or more, or four or more and 20 or less, 10 or less, 9 or less, 8 or less, 7 or less, or 6 or less monolayers of nanoparticles. The light emitting layer may have a thickness of greater than or equal to about 5 nm, for example, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example, about 10 nm to about 150 nm, about 20 nm to about 100 nm, or about 30 nm to about 50 nm.

In an embodiment, the light emitting layer may be a single layer or a multi-layered structure having at least two layers. In a multi-layered structure, adjacent layers (e.g., a first light emitting layer and a second light emitting layer) may be configured to emit a first light (e.g., green light, blue light, or red light). In a multi-layered structure, adjacent layers (e.g., a first light emitting layer and a second light emitting layer) may have the same or different composition, ligands, or a combination thereof. In an embodiment, the (multi-layered) light emitting layer may exhibit a halogen content that varies (increase or decrease) in a thickness direction. In an embodiment, in the (multi-layered) light emitting layer, the amount of the halogen may increase in a direction toward the electron auxiliary layer. In the (multi-layered) light emitting layer, the content of the organic ligand may decrease in a direction toward the electron auxiliary layer. In the (multi-layered) light emitting layer, the content of the organic ligand may increase in a direction toward the electron auxiliary layer.

In an electroluminescent device of an embodiment, the light emitting layer in combination of an electron transport layer including a metal oxide nanoparticles may be configured to exhibit a desired level of an electroluminescent property. The light emitting layer including the semiconductor nanoparticles may be prepared in a solution based process and the electron transport layer including the metal oxide nanoparticles may be prepared on the light emitting layer via a solution based process, which may give an additional advantage in light of the production process.

However, the present inventors have found that the combination of the light emitting layer including the semiconductor nanoparticles and the electron transport layer including the metal oxide nanoparticles may be insufficient to achieve both a desired level of lifespan and desired electroluminescent properties. Without wishing to be bound by any theory, it is believed that a relatively high level of an energy barrier (e.g., that is greater than or equal to about 1.0 eV) may be present between the light emitting layer including the semiconductor nanoparticles (e.g., emitting blue light) and the electron transport layer including the metal oxide nanoparticles, charges may be accumulated around the light emitting layer and such an accumulation of the charges may result in a non-radiative recombination in the semiconductor nanoparticles (e.g., including a zinc sulfide) included in the light emitting layer, and a decrease in the efficiency of the device may be caused. In addition, it is believed that the metal oxide nanoparticles included in the electron transport layer may have a deep trap band that may facilitate a hole leak, e.g., leakage of holes, through the electron injection layer trap and may have an adverse effect on the electroluminescent properties of the device. The present inventors have also found that the electroluminescent device including the metal oxide nanoparticle based electron transport layer may have a difficulty in exhibiting a sufficient level of a current flow at a relatively low level of a voltage.

Figure 6:
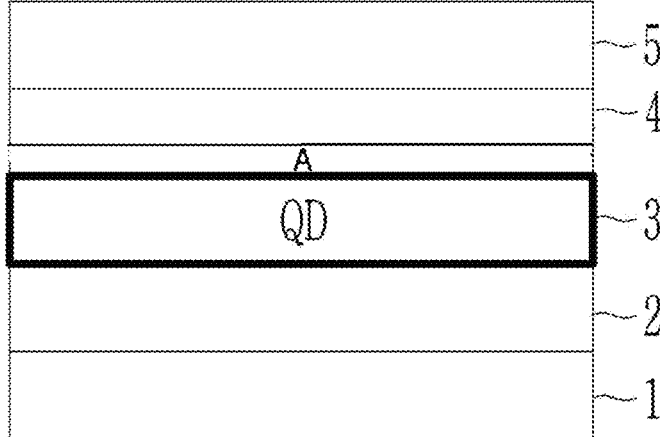
FIG. 6 is a schematic cross-sectional view of a light-emitting device according to an embodiment.

In an embodiment, the electroluminescent device may include a polycarboxylic acid and a halogen in the light emitting layer (e.g., at an interface between the light emitting layer and the electron transport layer, see FIG. 6). In an embodiment, the polycarboxylic acid compound may be present in the light emitting layer (e.g., at a surface of the light emitting layer facing the electron transport layer). In an embodiment, a top surface of the light emitting layer or an interface between the light emitting layer and the electron transport layer may include the polycarboxylic acid compound.

Surprisingly, it has been found that by the inclusion of both the polycarboxylic acid compound and the halogen, the electroluminescent device of an embodiment may exhibit both improved electroluminescent properties and increased lifespan. Without wishing to be bound by any theory, it is believed that the presence of both the polycarboxylic acid compound and the halogen in the light emitting layer may impart sufficient passivation (e.g., full passivation) to a surface of the light emitting layer and a surface of the electron transport layer. Without wishing to be bound by any theory, it is believed that the co-presence of, e.g., the presence of both, the halogen and the polycarboxylic acid compound may change a surface state of the semiconductor nanoparticle included in the light emitting layer, which may have an effect on the properties of the light emitting layer.

The polycarboxylic acid compound may have a carbon number of greater than or equal to about 2, greater than or equal to about 3, greater than or equal to about 4, greater than or equal to about 5, greater than or equal to about 6, greater than or equal to about 7, or greater than or equal to about 8. The polycarboxylic acid compound may have a carbon number of less than or equal to about 150, less than or equal to about 100, less than or equal to about 90, less than or equal to about 70, less than or equal to about 50, less than or equal to about 40, less than or equal to about 20, less than or equal to about 15, less than or equal to about 14, less than or equal to about 13, less than or equal to about 12, less than or equal to about 11, less than or equal to about 10, less than or equal to about 9, less than or equal to about 8, less than or equal to about 7, less than or equal to about 6, or less than or equal to about 5. In an embodiment, the polycarboxylic acid compound may have a carbon number of less than or equal to about 15, less than or equal to about 14, less than or equal to about 13, less than or equal to about 12, less than or equal to about 11, less than or equal to about 10, less than or equal to about 9, less than or equal to about 8, less than or equal to about 7, less than or equal to about 6, or less than or equal to about 5. In an embodiment, the polycarboxylic acid compound may have a carbon number of 2 to 150, or 2 to 90, or 2 to 60, or 2 to 30, or 2 to 15, or 3 to 12, for example. The polycarboxylic acid compound may be a compound having greater than or equal to about 2, greater than or equal to about 3, greater than or equal to about 4, greater than or equal to about 5, greater than or equal to about 6, greater than or equal to about 7, or greater than or equal to about 8 carboxylic acid groups. The polycarboxylic acid compound may be a compound having less than or equal to about 10, less than or equal to about 9, less than or equal to about 8, less than or equal to about 7, less than or equal to about 6, or less than or equal to about 5 carboxylic acid groups. The polycarboxylic acid compound may be a compound having 2 to about 10 carboxylic acid groups, or 2 to about 5 carboxylic acid groups, or 2 to 3 carboxylic acid groups.

An acid dissociation constant (pKa) of the polycarboxylic acid compound (e.g., $pKa_1$ or $pKa_2$) may be greater than or equal to about 1.2, greater than or equal to about 1.3, greater than or equal to about 1.9, greater than or equal to about 2, greater than or equal to about 2.5, greater than or equal to about 3, greater than or equal to about 3.5, greater than or equal to about 4, or greater than or equal to about 4.5. The polycarboxylic acid compound may have a pKa of less than or equal to about 10, less than or equal to about 9, less than or equal to about 8, less than or equal to about 7, less than or equal to about 6, less than or equal to about 5, less than or equal to about 4.5, less than or equal to about 4, less than or equal to about 3.5, less than or equal to about 3, less than or equal to about 2.5, or less than or equal to about 2.

The polycarboxylic acid compound may have a $pKa_1/pKa_2$ value of less than or equal to about 1,000, less than or equal to about 500, less than or equal to about 300, less than or equal to about 200, less than or equal to about 100, less than or equal to about 50, or less than or equal to about 20. The polycarboxylic acid compound may have a $pKa_1/pKa_2$ value of greater than or equal to about 3, greater than or equal to about 10, or greater than or equal to about 12.

The polycarboxylic acid compound may have a molecular weight of greater than or equal to about 30 grams per mole (g/mol), greater than or equal to about 50 g/mol, greater than or equal to about 60 g/mol, greater than or equal to about 70 g/mol, greater than or equal to about 80 g/mol, greater than or equal to about 90 g/mol, greater than or equal to about 100 g/mol, greater than or equal to about 110 g/mol, or greater than or equal to about 120 g/mol.

The polycarboxylic acid compound may have a molecular weight of less than or equal to about 3,000 g/mol, less than or equal to about 2,000 g/mol, less than or equal to about 1,500 g/mol, less than or equal to about 1,000 g/mol, less than or equal to about 800 g/mol, less than or equal to about 600 g/mol, less than or equal to about 400 g/mol, less than or equal to about 300 g/mol, or less than or equal to about 200 g/mol.

The polycarboxylic acid compound may include succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof.

The polycarboxylic acid compound may be dissolved in a solvent including water, a C1 to C10 alcohol solvent, or a combination thereof. The polycarboxylic acid compound may exhibit, with respect to the solvent (e.g., water), a solubility of greater than or equal to about 90 grams per liter (g/L), greater than or equal to about 300 g/L, greater than or equal to about 400 g/L, or greater than or equal to about 500 g/L. The solubility of the polycarboxylic acid compound may be from about 90 g/L to about 10,000 g/L, or from about 600 g/L to about 1,000 g/L, or a combined range of any numerical limit disclosed herein.

The polycarboxylic acid compound may include a compound represented by $HOOC-A-(COOH)_m$, wherein A is a direct bond, a substituted or unsubstituted C1 to C20 (or C12) aliphatic hydrocarbon such as an alkylene, an alkenylene, or an alkynylene, a substituted or unsubstituted C6 to C40 aromatic hydrocarbon, a substituted or unsubstituted C3 to C40 alicyclic hydrocarbon, or a combination thereof, m is greater than or equal to about 1, e.g., greater than or equal to 1, greater than or equal to about 2, greater than or equal to about 3, or greater than or equal to about 4 and less than or equal to about 10, less than or equal to about 8, less than or equal to about 6, or less than or equal to about 3. In the A moiety, a, e.g., at least one, methylene may be replaced with —CO—, —NH—, —O—, —COO—, or a combination thereof.

The halogen may include fluorine, chlorine, iodine, or a combination thereof.

The halogen may be in a form of a halogen compound, a halogen moiety derived therefrom, or a combination thereof. The halogen may be included in a form of a metal halide, a halogen containing an onium salt (e.g., a halogen containing oxonium) compound, or a combination thereof.

The metal halide may include a zinc halide or a combination of two or more different zinc halides. The halogen onium compound may include a trialkyl oxonium fluoroborate (e.g., trimethyloxonium tetrafluoroborate, CAS no.: 420-37-1).

The halogen compound may be dissolved in a C1 to C10 alcohol solvent, a $C_{2-20}$ nitrile solvent (e.g., RCN, wherein R is a substituted or unsubstituted C1 to C19 hydrocarbon), a $C_{3-50}$ ester solvent (e.g., RCOOR, wherein each R is independently a substituted or unsubstituted C1 to C19 hydrocarbon), or a combination thereof.

In an embodiment, the forming of the light emitting layer may be performed by obtaining a coating liquid including semiconductor nanoparticles and an organic solvent (e.g., an alkane solvent such as octane, heptane, or the like, an aromatic solvent such as toluene, or a combination thereof) and applying or depositing the coating liquid on a substrate or charge auxiliary layer (e.g., a hole auxiliary layer) in an appropriate manner (e.g., by spin coating, inkjet printing, etc.). A type of the organic solvent for the coating liquid is not particularly limited and may be selected appropriately. In an embodiment, the organic solvent may include a substituted or unsubstituted aliphatic hydrocarbon, a substituted or unsubstituted aromatic hydrocarbon, a substituted or unsubstituted alicyclic hydrocarbon, an acetate solvent, or a combination thereof.

In an embodiment, the formation of the light emitting layer may further include contacting the film of the semiconductor nanoparticles with a metal halide (e.g., a zinc chloride)-containing organic solution (e.g., including an alcohol solvent). In an embodiment, the light emitting layer may include a first light emitting layer including a first semiconductor nanoparticle and a second light emitting layer including a second semiconductor nanoparticle, wherein the first semiconductor nanoparticle has a halogen (e.g., chlorine) exchanged surface and the second light emitting layer has an increased amount of an organic ligand. A halogen (e.g., chlorine) amount and an organic ligand amount of the light emitting layer may be controlled with an appropriate manner (e.g., a post treatment for the formed layer). In an embodiment, a thin film of the semiconductor nanoparticles having an organic ligand (e.g., having a carboxylic acid group) is formed, which is then treated with a solution including a metal halide (e.g., a zinc halide such as a zinc chloride in alcohol solvent) to control an amount of the organic ligand of the semiconductor nanoparticles in the thin film. The treated thin film may have an increased halogen amount, showing, e.g., exhibiting, a changed property (e.g., solubility) to, e.g., relative to, an organic solvent, and it may be possible to form a layer of semiconductor nanoparticles having a different amount of an organic ligand (e.g., a halogen treated semiconductor nanoparticle or a semiconductor nanoparticle with a ligand having a carboxylic acid group) on the treated thin film, subsequently.

Figure 7:
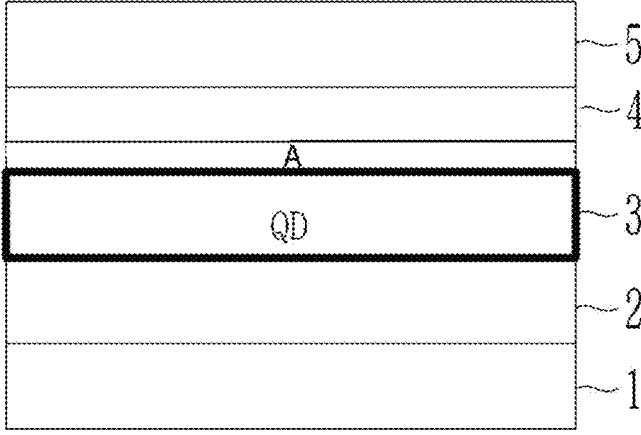
FIG. 7 is a schematic cross-sectional view of a light-emitting device according to an embodiment.

In an embodiment, the formation of the light emitting layer may further include preparing a treating liquid including the polycarboxylic acid compound and the halogen in a first organic solvent; applying the treating liquid on the light emitting layer; optionally further including washing the light emitting layer to which the treating liquid has been applied with a second organic solvent; heat-treating the light emitting layer to which the treating liquid has been applied, which has optionally been washed, at a temperature of greater than or equal to about 80° C., or greater than or equal to about 100° C. and less than or equal to about 250° C., or less than or equal to about 230° C. After the heat-treating, an electron transport layer is formed on the light emitting layer. See FIG. 7.

In an embodiment, the treating liquid may include a halogen compound. In an embodiment, the treating may be carried out sequentially by using a first treating liquid including a halogen compound and a second treating liquid including a polycarboxylic acid compound. In an embodiment, the treating may be carried out in a single step by using a treating liquid including the halogen compound and the polycarboxylic acid compound.

In an embodiment, the electroluminescent device prepared by treating the treating liquid of the halogen compound and the polycarboxylic acid compound may exhibit both improved electroluminescent properties and increased lifespan.

The first organic solvent, the second organic solvent, or a combination thereof may include a $C_{1-10}$ alcohol (e.g., ethanol, methanol, propanol, butanol, pentanol, or the like), a cyanide solvent such as acetonitrile, an ester solvent such as ethyl acetate, or a combination thereof. The first organic solvent and the second organic solvent may be the same or different.

The polycarboxylic acid compound and the halogen compound are described herein.

A concentration of the polycarboxylic acid compound and a concentration of the halogen compound in the treating liquid may be selected appropriately and are not particularly limited. In an embodiment, the concentration of the poly-carboxylic acid compound in the treating liquid may be about 0.000001 molar (moles/liter (M)) to about 10 M, about 0.00001 M to about 5 M, about 0.0001 M to about 4 M, about 0.0005 M to about 3 M, about 0.001 M to about 2 M, about 0.005 M to about 1.5 M, about 0.01 M to about 1.3 M, about 0.05 M to about 1.2 M, about 0.1 M to about 1 M, about 0.15 M to about 0.9 M, about 0.2 M to about 0.8 M, about 0.3 M to about 0.7 M, about 0.4 M to about 0.6 M, about 0.45 M to about 0.55 M, or a combination thereof. In an embodiment, the concentration of the polycarboxylic acid compound in the treating liquid may be about 0.000001 M to about 10 M, about 0.00001 M to about 5 M, about 0.0001 M to about 4 M, about 0.0005 M to about 3 M, about 0.001 M to about 2 M, about 0.005 M to about 1.5 M, about 0.01 M to about 1.3 M, about 0.05 M to about 1.2 M, about 0.1 M to about 1 M, about 0.15 M to about 0.9 M, about 0.2 M to about 0.8 M, about 0.3 M to about 0.7 M, about 0.4 M to about 0.6 M, about 0.45 M to about 0.55 M, or a combination thereof.

A manner of applying the treating liquid on the light emitting layer is not particularly limited and selected appropriately. The applying of the treating liquid may include a spin-coating, a dropwise depositing, or a combination thereof. Excess treating liquid after the application thereof may be removed by spinning. The applied treating liquid may be maintained on the light emitting layer for a predetermined time (for example, greater than or equal to 10 seconds, greater than or equal to about 30 seconds, greater than or equal to about 1 minute, greater than or equal to 2 minutes, greater than or equal to about 3 minutes, greater than or equal to about 5 minutes, or greater than or equal to about 10 minutes and less than or equal to about 1 hour, less than or equal to about 30 minutes, or less than or equal to about 7 minutes. Without wishing to be bound by any theory, it is believed that during the treating time, a native ligand that is coordinated or bound to the surface of the semiconductor nanoparticle (e.g., an organic ligand or solvent disposed on the nanoparticle during a wet chemical synthesis) may be exchanged with the polycarboxylic acid compound and the halogen compound.

After the treating time, the treated light emitting layer may be washed with a second organic solvent, if desired. A manner of the washing is not particularly limited and may be conducted by a spin and dry, a dipping, or a combination thereof. By the washing, at least a portion of excess treating liquid may be removed.

The light emitting layer, optionally washed, may be heat-treated. The heat treating may be carried out in air or in an inert gas atmosphere. A temperature of the heat treating may be greater than or equal to about 50° C., greater than or equal to about 70° C., greater than or equal to about 90° C., greater than or equal to about 100° C., greater than or equal to about 120° C., greater than or equal to about 150° C., greater than or equal to about 170° C., or greater than or equal to about 200° C. A temperature of the heat treating may be less than or equal to about 250° C., less than or equal to about 230° C., less than or equal to about 200° C., less than or equal to about 180° C., less than or equal to about 160° C., less than or equal to about 140° C., or less than or equal to about 130° C. Without wishing to be bound by any theory, it is believed that the heat-treating may enhance the passivation of the light emitting layer.

The light emitting layer treated with the treating liquid containing the polycarboxylic acid compound may exhibit improved morphology. The treated light emitting layer may exhibit a reduced porosity. The porosity may be determined by obtaining an image from an electron microscopy analysis and analyzing the obtained microscopy image with a computer program or code (e.g., a commercially available or in-house program such as ImageJ). The porosity may be greater than or equal to about 0.1%, greater than or equal to about 0.3%, greater than or equal to about 0.5%, greater than or equal to about 0.7%, or greater than or equal to about 0.9%, and less than or equal to about 5%, less than or equal to about 4.5%, less than or equal to about 4%, less than or equal to about 3.5%, less than or equal to about 3%, less than or equal to about 2.5%, less than or equal to about 2%, less than or equal to about 1.9%, or less than or equal to about 1.8%.

It has been found that the light emitting layer of an embodiment may have improved morphology (for example, a reduced porosity) in comparison with an untreated light emitting layer or a light emitting layer including quantum dots on the surfaces of which a portion of an organic ligand has been replaced with the halogen. Moreover, it has been found that the light emitting layer of an embodiment may have improved morphology (for example, a reduced porosity) in comparison with a light emitting layer treated with the polycarboxylic acid compound only.

In the light emitting layer of the embodiment, the semiconductor nanoparticles may include zinc, and in the light emitting layer, a mole ratio of the halogen (e.g., chlorine) to the zinc may be greater than or equal to about 0.001:1, greater than or equal to about 0.003:1, greater than or equal to about 0.005:1, greater than or equal to about 0.007:1, greater than or equal to about 0.009:1, greater than or equal to about 0.01:1, greater than or equal to about 0.015:1, greater than or equal to about 0.02:1, greater than or equal to about 0.025:1, greater than or equal to about 0.03:1, greater than or equal to about 0.035:1, greater than or equal to about 0.04:1, greater than or equal to about 0.045:1, greater than or equal to about 0.05:1, greater than or equal to about 0.055:1, greater than or equal to about 0.06:1, greater than or equal to about 0.065:1, greater than or equal to about 0.07:1, greater than or equal to about 0.075:1, greater than or equal to about 0.08:1, greater than or equal to about 0.085:1, greater than or equal to about 0.09:1, greater than or equal to about 0.095:1, greater than or equal to about 0.1:1, greater than or equal to about 0.15:1, or greater than or equal to about 0.2:1. In the light emitting layer, the mole ratio of the halogen (e.g., chlorine) to the zinc may be less than or equal to about 0.5:1, less than or equal to about 0.4:1, less than or equal to about 0.3:1, less than or equal to about 0.2:1, less than or equal to about 0.1:1, less than or equal to about 0.09:1, less than or equal to about 0.08:1, less than or equal to about 0.07:1, less than or equal to about 0.06:1, or less than or equal to about 0.05:1.

In the light emitting layer, the amounts of the halogen and the zinc or the mole ratio therebetween may be determined in an appropriate analyzing tool such as a transmission electron microscopy0energy dispersive X-ray (TEM-EDX) instrument, an X-ray photoelectron spectroscopy (XPS) instrument, or the like.

An electron auxiliary layer is disposed on the light emitting layer, for example, between the light emitting layer and the second electrode. The electron auxiliary layer includes an electron transport layer. The electron transport layer includes a plurality of metal oxide nanoparticles. An electron injection layer may be disposed between the electron transport layer and the second electrode. The electron transport layer may be adjacent (e.g., directly adjacent or directly disposed on) the light emitting layer. In an embodiment, the light emitting layer may contact the electron transport layer.

The metal oxide of the nanoparticles in the electron transport layer may include a zinc oxide. In an embodiment, the zinc oxide may include $Zn_{1-x}M_xO$ (wherein M is Mg, Ca, Zr, W, Li, Ti, Y, Al, or a combination thereof, and $0 \leq x \leq 0.5$). A value of x may be greater than 0, greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. A value of x may be less than or equal to about 0.47, less than or equal to about 0.45, less than or equal to about 0.43, less than or equal to about 0.4, less than or equal to about 0.37, less than or equal to about 0.35, or less than or equal to about 0.3. The metal oxide (or the zinc oxide) may further include magnesium. The electron transport layer (or the zinc oxide) may include ZnO, $Zn_{1-x}M_xO$ (wherein, M is Mg, Ca, Zr, W, Li, Ti, Y, Al, or a combination thereof, and $0 \leq x \leq 0.5$), or a combination thereof.

An average size of the metal oxide nanoparticles may be greater than or equal to about 1 nm, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. An average size of the metal oxide nanoparticles may be less than or equal to about 10 nm, less than or equal to about 8 nm, less than or equal to about 7 nm, less than or equal to about 6 nm, less than or equal to about 5 nm, or less than or equal to about 4.5 nm.

In an embodiment, the metal oxide nanoparticles (e.g., the zinc oxide nanoparticles) may be prepared in any proper method, which is not particularly limited. In an embodiment, the zinc oxide (e.g., zinc magnesium oxide) nanoparticle may be prepared by placing a zinc compound (e.g., an organic zinc compound such as zinc acetate dihydrate) and optionally an additional metal compound (e.g., an organic additional metal compound such as magnesium acetate tetrahydrate) in an organic solvent (e.g., dimethylsulfoxide) in a flask to have a desired mole ratio and heating the same at a predetermined temperature (e.g., from about 40° C. to about 120° C., or from about 60° C. to about 100° C.) (e.g., in air), and adding a precipitation accelerator solution (for example, a solution of tetramethyl ammonium hydroxide pentahydrate and ethanol) at a predetermined rate with, e.g., while, stirring. The prepared zinc oxide nanoparticle (e.g., $Zn_xMg_{1-x}O$ nanoparticle) may be recovered from a reaction solution for example via centrifugation.

In an embodiment, the electroluminescent device includes the electron auxiliary layer (e.g., the electron transport layer) including the metal oxide nanoparticles on the light emitting layer including the polycarboxylic acid compound and the halogen together with the semiconductor nanoparticles and may show, e.g., exhibit, improved electroluminescent properties such as an EQE and enhanced lifetime. Without wishing to be bound by any theory, it is believed that inclusion of both the polycarboxylic acid compound and the halogen may provide surface passivation not only for the semiconductor nanoparticles but also for the metal oxide nanoparticles, and the interface quality therebetween may be improved.

In an embodiment, a thickness of the electron transport layer may be greater than or equal to about 3 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, greater than or equal to about 25 nm, greater than or equal to about 26 nm, greater than or equal to about 27 nm, greater than or equal to about 28 nm, greater than or equal to about 29 nm, greater than or equal to about 30 nm, greater than or equal to about 31 nm, greater than or equal to about 32 nm, greater than or equal to about 33 nm, greater than or equal to about 34 nm, or greater than or equal to about 35 nm. The thickness of the electron transport layer may be less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, or less than or equal to about 35 nm.

The electron transport layer may have a first surface facing the light emitting layer and a second surface opposite to the first surface. The electron transport layer may include a first layer including the first surface and a second layer including the second surface.

In an embodiment, a thickness of the first layer may be greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, or greater than or equal to about 9 nm. In an embodiment, a thickness of the first layer may be less than or equal to about 15 nm, less than or equal to about 13 nm, less than or equal to about 11 nm, less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm.

In an embodiment, a thickness of the second layer may be greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, or greater than or equal to about 30 nm.

In an embodiment, a thickness of the second layer may be less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, or less than or equal to about 15 nm.

In an embodiment, a zinc oxide nanoparticle of the first layer may further include or may not include Mg, Ca, Zr, W, Li, Ti, Y, Al, or a combination thereof. In an embodiment, a zinc oxide nanoparticle of the second layer may further include or may not include Mg, Ca, Zr, W, Li, Ti, Y, Al, or a combination thereof.

In an embodiment, the first layer may include ZnO nanoparticles and the second layer may include ZnMgO nanoparticles. In an embodiment, the second layer may include ZnO nanoparticles and the first layer may include ZnMgO nanoparticles. In an embodiment, the first layer may include ZnMgO nanoparticles and the second layer may include ZnMgO nanoparticles.

In an embodiment, the first layer (or a first portion), the second layer (or a second portion), or a combination thereof may further include or may not include a carbonate moiety.

In an embodiment, the first layer, the second layer, or a combination thereof may further include an alkali metal. The alkali metal may include an, e.g., at least one (e.g., at least two), alkali metal. In an embodiment, the first layer, the second layer, or a combination thereof may include cesium, rubidium, or a combination thereof.

In an embodiment, the electron transport layer may be prepared in a solution process. In an embodiment, the electron transport layer may be prepared by dispersing a plurality of metal oxide nanoparticles in an organic solvent (for example, a polar solvent, a non-polar solvent, or a combination thereof) to obtain an electron transport layer precursor dispersion, which is then applied to a surface to form a film. The electron transport layer precursor dispersion may be applied to the light emitting layer. The solution process may further include removing the organic solvent from the formed film for example by evaporation. The organic solvent may include a C1 to C10 alcohol solvent or a combination thereof.

In an embodiment, the electron auxiliary layer 4 may further include an electron injection layer, a hole blocking layer, or a combination thereof. A thickness of the electron injection layer, the hole blocking layer, or a combination thereof may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, or greater than or equal to about 21 and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto. In an embodiment, a material for the electron injection layer, the hole blocking layer, or a combination thereof may include 1,4,5,8-naphthalene-tetracarboxylic dianhydride (NTCDA), bathocuproine (BCP), tris[3-(3-pyridyl)-mesityl]borane (3TPYMB), LiF tris(8-hydroxyquinolinato)aluminum ($Alq_3$), tris(8-hydroxyquinolinato)gallium ($Gaq_3$), tris(8-hydroxyquinolinato)indium ($Inq_3$), bis-(8-hydroxyquinolinato) zinc ($Znq_2$), bis[2-(2-hydroxyphenyl)benzothiazolato]zinc ($Zn(BTZ)_2$), bis(10-hydroxybenzo[H]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), 2,2',2"-(1,3,5-Benzinetriyl)-tris(1-phenyl-1-H-benzimidazole) (TPBi), an n-type metal oxide (e.g., ZnO, $HfO_2$, etc.), 8-(4-(4,6-di(naphthalen-2-yl)-1,3,5-triazin-2-yl)phenyl)quinolone: 8-hydroxyquinolinato lithium (ET204:Liq), or a combination thereof, but is not limited thereto.

In an embodiment, the electroluminescent device may further include a hole auxiliary layer 2, 20 between the first electrode 1 and the light emitting layer 3. The hole auxiliary layer 2, 20 may include a hole injection layer, a hole transport layer, an electron blocking layer, or a combination thereof. The hole auxiliary layer 2, 20 may be a single layer or a multilayer structure in which adjacent layers include different components.

The HOMO energy level of the hole auxiliary layer 2 may have a HOMO energy level that can be matched with the HOMO energy level of the light emitting layer 3 in order to enhance mobility of holes transferred from the hole auxiliary layer 2 to the light emitting layer 3. In an embodiment, the hole auxiliary layer 2 may include a hole injection layer close to, e.g., adjacent, the first electrode 1 and a hole transport layer close to, e.g., adjacent, the light emitting layer 3.

The material included in the hole auxiliary layer 2 (e.g., a hole transport layer, a hole injection layer, or an electron blocking layer) is not particularly limited, and may include, for example, poly(9,9-dioctyl-fluorene-co-N-(4)-butylphenyl)-diphenylamine) (TFB), polyarylamine, poly(N-vinyl-carbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4,4'-bis[N-(1-naphthyl)-N-phenyl-amino]biphenyl ($\alpha$-NPD), m-MTDATA (4,4',4"-Tris[phenyl(m-tolyl)amino]triphenylamine), 4,4', 4"-tris(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

A device according to an embodiment as shown in FIG. 2 may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS, p-type metal oxide, or a combination thereof; a hole transport layer such as TFB, polyvinylcarbazole (PVK), or a combination thereof; or a combination thereof) may be provided between the transparent electrode 10 and the light emitting layer 30. The hole injection layer may be disposed close to, e.g., adjacent, the transparent electrode and the hole transport layer may be disposed close to, e.g., adjacent, the light emitting layer. The electron auxiliary layer 40 such as an electron injection/transport layer may be disposed between the light emitting layer 30 and the cathode 50.

A device according to an embodiment may have an inverted structure as depicted in FIG. 3. Herein, the cathode

50 disposed on the transparent substrate 100 may include a metal oxide-based transparent electrode (e.g., ITO), and the anode 10 facing the cathode may include a metal (e.g., having a relatively high work function, such as Au, Ag, etc.). For example, an (optionally doped) n-type metal oxide (e.g., crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB, PVK, or a combination thereof; a hole injection layer including $MoO_3$ or other p-type metal oxide; or a combination thereof) between the metal anode 10 and the light emitting layer 30.

The electroluminescent device of an embodiment may be manufactured by an appropriate method. In an embodiment, the electroluminescent device may be manufactured by optionally forming a hole auxiliary layer (e.g., by deposition or coating) on a substrate on which an electrode is disposed, forming a light emitting layer including a semiconductor nanoparticle (e.g., a pattern of, e.g., including, the aforementioned semiconductor nanoparticle), forming an electron auxiliary layer on the light emitting layer, and then forming an electrode (e.g., by vapor deposition or coating) on the electron transport layer. A method of forming the electrode/hole auxiliary layer/electron auxiliary layer such as an electron injection layer may be appropriately selected and is not particularly limited. The formation of the light emitting layer and the electron transport layer are the same as described herein.

In an embodiment, an electroluminescent device including a first electrode and a second electrode spaced apart from each other (e.g., each electrode having a surface opposite the other), and a light emitting layer disposed between the first electrode and the second electrode, and an electron transport layer disposed between the light emitting layer and the second electrode, wherein the electroluminescent device is configured to emit blue light.

The light emitting layer includes a plurality of semiconductor nanoparticles, the plurality of semiconductor nanoparticles includes (a zinc chalcogenide including) zinc, selenium, and sulfur, and optionally further includes tellurium, and the electron transport layer includes a plurality of zinc oxide nanoparticles, and the light emitting layer further includes halogen. In the light emitting layer, a mole ratio of halogen to zinc is greater than or equal to about 0.001:1 (or greater than or equal to about 0.01:1) and less than or equal to about 0.5, or less than or equal to about 0.3:1. The light emitting layer exhibits a porosity of greater than or equal to about 0.1%, or greater than or equal to about 0.5% and less than or equal to about 5%, less than or equal to about 2.5%, or less than or equal to about 2%. Details of the electroluminescent device are the same as described herein.

The electroluminescent device of an embodiment may exhibit both improved electroluminescent properties, for example, and a longer lifespan as described herein.

In an embodiment, the electroluminescent device may have a maximum external quantum efficiency (EQE) of greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.5%, greater than or equal to about 10%, greater than or equal to about 10.5%, greater than or equal to about 11%, greater than or equal to about 11.5%, greater than or equal to about 12%, greater than or equal to about 12.5%, greater than or equal to about 13%, greater than or equal to about 13.5%, or greater than or equal to about 14%. The maximum external quantum efficiency (EQE) may be less than or equal to about 50%, less than or equal to about 40%, less than or equal to about 30%, or less than or equal to about 20%.

The electroluminescent device of an embodiment may show, e.g., exhibit, a maximum luminance of greater than or equal to about 60,000 $cd/m^2$, greater than or equal to about 80,000 $cd/m^2$, greater than or equal to about 90,000 $cd/m^2$, greater than or equal to about 100,000 $cd/m^2$, or greater than or equal to about 200,000 $cd/m^2$. The maximum luminance may be less than or equal to about 5,000,000 $cd/m^2$, less than or equal to about 1,000,000 $cd/m^2$, or less than or equal to about 900,000 $cd/m^2$.

In an embodiment, as measured by driving the device at a predetermined luminance (for example, about 650 nit) the electroluminescent device may have a T50 of greater than or equal to about 20 hours, greater than or equal to about 25 hours, greater than or equal to about 30 hours, greater than or equal to about 40 hours, greater than or equal to about 50 hours, greater than or equal to about 60 hours, greater than or equal to about 65 hours, or greater than or equal to about 70 hours. The T50 may be about 25 hours to about 1,000 hours, 26 hours to about 500 hours, about 26.5 hours to about 300 hours, or a combination thereof.

In an embodiment, as measured by driving the device at a predetermined luminance (for example, about 650 nit) the electroluminescent device may have a T90 of greater than or equal to about 5 hours, greater than or equal to about 6 hours, greater than or equal to about 7 hours, greater than or equal to about 7.5 hours, greater than or equal to about 8 hours, greater than or equal to about 9 hours, greater than or equal to about 10 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, or greater than or equal to about 90 hours. In an embodiment, as measured by driving the device at a predetermined luminance (for example, about 650 nit) the electroluminescent device may have a T90 of from 7 hours to about 1,000 hours, from about 8 hours to about 800 hours, or a combination thereof.

In an embodiment, a display device includes the electroluminescent device described herein.

The display device may include a first pixel and a second pixel that is configured to emit light different from, e.g., a different colored light than, the first pixel. The first pixel, the second pixel, or a combination thereof may include the electroluminescent device of an embodiment. The display device may include a blue pixel, a red pixel, a green pixel, or a combination thereof. In the display device, the red pixel may include a red light emitting layer including a plurality of red light emitting semiconductor nanoparticles, the green pixel may include a green light emitting layer including a plurality of green light emitting semiconductor nanoparticles, and the blue pixel may include a blue light emitting layer including a plurality of blue light emitting semiconductor nanoparticles, The display device or an electronic apparatus may include (or may be) a television, a virtual reality/augmented reality (VR/AR), a handheld terminal, a monitor, a notebook computer, an electronic display board, a camera, or a part for an automatic, e.g., autonomous, vehicle.

Specific examples are described below. However, the examples described below are only for specifically illustrating or explaining the disclosure, and the scope of the disclosure is not limited thereto.

EXAMPLES

1. Electroluminescence Measurement

A current according to an applied voltage is measured with a Keithley 2635B source meter, and a CS2000 spectrometer is used to measure electroluminescent properties (e.g., luminance) of a light-emitting device.

2. Life-Span Characteristics

T90: The time (hr) for the brightness of a device driven (operated) at a predetermined brightness (e.g., 650 nit), to decrease to 90% of the initial brightness (100%).

3. Transmission Electron Microscopy (TEM) Analysis

Transmission electron microscopy analysis is conducted using an UT F30 Tecnai electron microscope.

4. Photoluminescence Analysis

Photoluminescence (PL) spectroscopy analysis is conducted using a Hitachi F-7000 spectrophotometer.

The following synthesis is performed under an inert gas atmosphere (e.g., under nitrogen) unless otherwise specified. A precursor content is provided as a molar content, unless otherwise specified.

Synthesis Example 1

A Se/trioctylphosphine (TOP) stock solution, a S/TOP stock solution, and a Te/TOP stock solution are prepared by dispersing selenium (Se), sulfur (S), and tellurium (Te) in trioctylphosphine (TOP), respectively. In a reactor containing trioctylamine, 0.125 millimoles (mmol) of zinc acetate is added to the reactor with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1:20 are rapidly injected into, e.g., added to, the reactor. When the reaction is complete, the reaction solution is rapidly cooled to room temperature and acetone is added to the reactor. The resulting product mixture is centrifuged and the formed precipitate is separated and dispersed in toluene to prepare a ZnSeTe core particle.

Amounts of 1.8 mmol of zinc acetate and oleic acid are added to a flask containing trioctylamine and the prepared mixture is heated at 120° C. under vacuum for 10 minutes. Nitrogen ($N_2$) is then introduced into the reactor, which is heated to 180° C., and the prepared ZnTeSe core particles are added quickly to the reactor and the Se/TOP stock solution and the S/TOP stock solution are injected thereinto, as well. At a reaction temperature of about 280° C., the reaction is carried out. When the reaction is complete, the reactor is cooled to room temperature and ethanol is added to facilitate precipitation of the semiconductor nanoparticles, which are separated by centrifuge. The prepared semiconductor nanoparticles emit blue light, and the PL analysis confirm that the blue light has a maximum luminescent peak wavelength of about 455 nanometers (nm).

The synthesized semiconductor nanoparticles (optical density 0.25 at 420 nm, 6 milliliters (mL)) are precipitated with ethanol and centrifuged and dispersed again in cyclohexane to prepare a cyclohexane dispersion. A solution of zinc chloride (0.022 moles) and ethanol is added to the cyclohexane dispersion and stirred at 80° C. for 30 minutes.

The treated semiconductor nanoparticles are recovered via centrifugation and dispersed in octane to prepare an octane dispersion.

Synthesis Example 2: Synthesis of ZnMgO Nanoparticles

Zinc acetate dihydrate and magnesium acetate tetrahydrate are added into a reactor including dimethylsulfoxide to provide a mole ratio according to the following chemical formula and heated at 60° C. in an air atmosphere. Subsequently, a solution of tetramethylammonium hydroxide pentahydrate and ethanol is added into the reactor in a dropwise fashion at a speed of 3 milliliters per minute (mL/min). After stirring the mixture, the prepared $Zn_{1-x}Mg_xO$ nanoparticles are centrifuged and dispersed in ethanol to provide an ethanol dispersion of $Zn_{1-x}Mg_xO$ (x=0.15) nanoparticles.

The prepared nanoparticles are analyzed by a transmission electron microscopic analysis, and the results show that the particles have an average particle size of about 3 nm.

Example 1

Zinc magnesium oxide nanoparticles prepared in Synthesis Example 2 are dispersed in ethanol to prepare an electron transport layer (ETL) dispersion. Zinc chloride ($ZnCl_2$) and citric acid (CtA) are dispersed in ethanol to prepare a treating liquid. A concentration of the zinc chloride and a concentration of the citric acid in the treating liquid are 0.1 moles/liter (molar (M)) and 0.1 M, respectively.

A glass substrate deposited with indium tin oxide (ITO) is surface treated with ultraviolet (UV)-ozone for 15 minutes, and then spin-coated with a poly(3,4-ethylenedioxythiophene) polystyrene sulfonate (PEDOT:PSS) solution (H.C. Starks) and heated at 150° C. for 10 minutes under air atmosphere and heated again at 150° C. for 20 to 30 minutes under $N_2$ atmosphere to provide a hole injection layer (HIL) having a thickness of 30 nm.

Subsequently, poly[(9,9-dioctylfluorenyl-2,7-diyl-co(4, 4'-(N-4-butylphenyl)diphenylamine] solution (TFB) (Sumitomo) is spin-coated on the hole injection layer and heated at 150° C. for 30 minutes to provide a hole transport layer (HTL) having a thickness of 25 nm.

The octane dispersion of the semiconductor nanoparticles prepared from Synthesis Example 1 is spin-coated on the prepared hole transport layer to prepare a light emitting layer having a thickness of 32 nm.

Each of the first to fourth dispersions is spin-coated on the light emitting layer and a heat treatment at 80° C. for 30 minutes is performed to provide an electron transport layer having a thickness of 30 nm.

On the light emitting layer, the treating liquid is drop-casted, kept for 60 seconds, and is spun away. The treated light emitting layer is washed with ethanol to remove excess treating liquid, and then is heat-treated at a temperature of about 150° C. in a nitrogen atmosphere for 30 minutes.

The ETL dispersion is spin-coated onto the heat-treated light emitting layer and is heat-treated again at 80° C. to form an electron transport layer with a thickness of about 20 nm.

Aluminum (Al) is vacuum-deposited on the prepared electron transport layer to prepare a second electrode of a thickness of about 100 nm, providing an electroluminescent device.

Electroluminescent properties of the prepared device are measured and the results are shown in Table 1.

Example 2

An electroluminescent device is prepared in the same manner as Example 1 except that a treating liquid is prepared by using malonic acid (MIoA) instead of citric acid. For the prepared device, electroluminescent properties are measured and the results are shown in Table 1.

Comparative Example 1

An electroluminescent device is prepared in the same manner as Example 1 except that the treating liquid is not used. For the prepared device, electroluminescent properties are measured and the results are shown in Table 1.

Comparative Example 2

An electroluminescent device is prepared in the same manner as Example 1 except that the treating liquid does not include the citric acid and in the treating liquid, a concentration of the zinc chloride is 0.2 M. For the prepared device, electroluminescent properties are measured and the results are shown in Table 1.

TABLE 1

|  | max EQE (%) | T90 (hours) |
|---|---|---|
| Example 1 (CtA + ZnCl$_2$) | 13.7% | 8.2 |
| Example 2 (MIoA + ZnCl$_2$) | 12.9% | 8.2 |
| Comparative Example 1 (ethanol washing only) | 7.7% | 5.9 |
| Comparative Example 2 (ZnCl$_2$) | 10.5% | 7.5 |

The results of Table 1 confirm that the electroluminescent devices of Examples 1 and 2 show, e.g., exhibit, both significantly improved max EQE and lengthened, e.g., increased, lifespan, in comparison with the electroluminescent devices of Comparative Examples 1 and 2.

Experimental Example 1

A photoluminescent spectroscopy analysis is carried out for the devices of Example 1 and Comparative Examples 1 and 2, and the results are shown in Table 2.

TABLE 2

|  | A Relative PL intensity |
|---|---|
| Comparative Example 1 | 100% |
| Example 1 | 150% |
| Comparative Example 2 | 120% |

The results of Table 2 confirm that the electroluminescent device of Example 1 shows, e.g., exhibits, significantly improved luminescent properties, in comparison with the electroluminescent devices of Comparative Examples.

Experimental Example 2

Figure 4A:
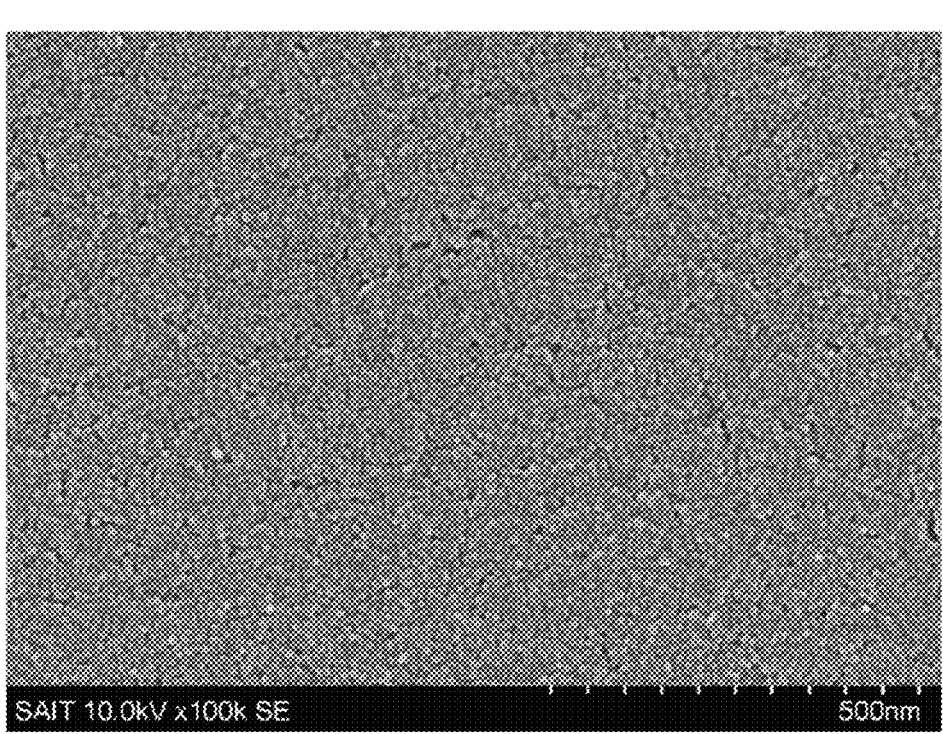
FIG. 4A is an electron microscopy image of a surface of a light emitting layer prepared in Example 1.
Figure 4B:
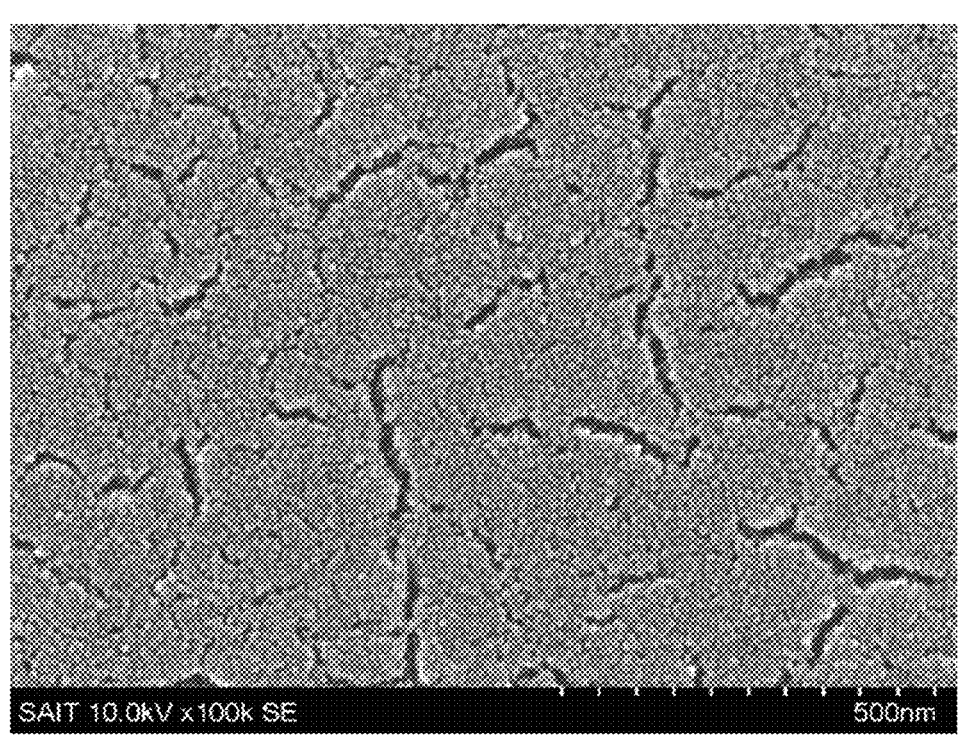
FIG. 4B is an electron microscopy image of a surface of a light emitting layer prepared in Example 1.

A surface of the light emitting layer of Example 1 and a surface of the light emitting layer of Comparative Example 2 are observed with a transmission electron microscope and the results are shown in FIG. 4A (Example 1) and FIG. 4B (Comparative Example 2).

The results of FIG. 4A and FIG. 4B confirm that in the light emitting layer of Example 1, crack generation or crack occurrence can be minimized, showing, e.g., exhibiting, significantly improved film morphology in comparison with the light emitting layer of Comparative Example 1.

For each of the light emitting layers of Example 1 and Comparative Example 2, a porosity is measured by using an in-house code program for an image analysis.

Porosity is a percentage of a total pore area (e.g., black portions in FIG. 4A and FIG. 4B) in, e.g., based on, a total area of the layer. The area assigned to the pore may be determined readily and reproducibly using a commercial or non-commercial image processing program and a user guide thereof. In Experimental Example 2, an in-house code is made using a Python image analysis module with classifying a portion having a shadow value below a predetermined standard, which is not limited thereto.

The results of analyzing the light emitting layer using a transmission electron microscopy analysis confirm that the light emitting layer of Example 1 has a porosity of about 1.74% and the light emitting layer of Comparative Example 2 has a porosity of about 7.1%.

Experimental Example 3

The light emitting layers are formed in substantially the same manner as Example 1 and Comparative Example 1, respectively, and for each of the light emitting layers, a gas chromatography-mass spectrometry (GC Mass) analysis is carried out to calculate a total amount of the aliphatic carboxylic acid (organic ligand) for each of the light emitting layers (i.e., an amount of the aliphatic carboxylic acid (organic ligand) for the light emitting layer of Example 1 relative to Comparative Example 1). The results are shown in Table 3.

TABLE 3

|  | Relative amount |
|---|---|
| Comparative Example 1 | 1 |
| Example 1 | 0.44 |

The results of Table 3 confirm that in the electroluminescent device of Example 1, the light emitting layer has a reduced amount of organics in comparison with the electroluminescent device of Comparative Example 1. Without wishing to be bound by any theory, it is believed that a decrease of organics may contribute to decreasing a resistance, improving a current injection characteristic, and operating a device at a lower resistance.

Experimental Example 4: Hole Only Device (HOD) Analysis

A hole only device is prepared in the same manner as Example 1, Example 2, and Comparative Example 2 except for forming the hole auxiliary layer instead of the electron transport layer.

Figure 5:
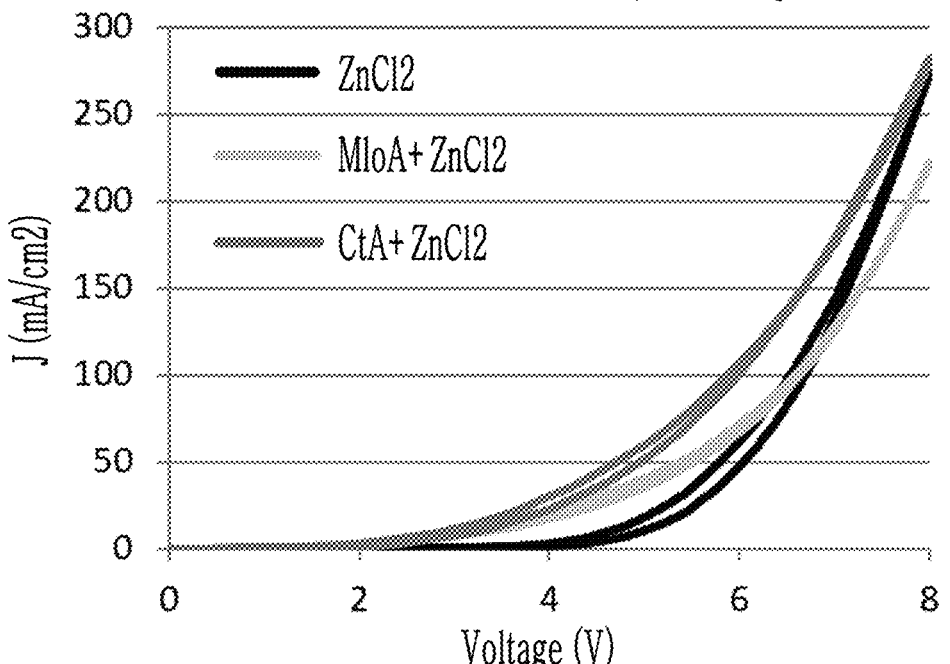
FIG. 5 is a graph of current density (J (milliamperes per square centimeter (mA/cm2))) versus voltage (volts (V)) for a hole only device prepared in Experimental Example 2.

While applying the voltage to the prepared HOD, the current (the third sweep) is measured and the results are shown in Table 4 and FIG. 5.

TABLE 4

| Treating liquid | Current density (J, mA/cm$^2$) @ 5 volts (V), 3$^{rd}$ sweep |
|---|---|
| ZnCl$_2$ | 18 |
| Malonic acid (MloA) + ZnCl$_2$ | 43.3 |
| Citric acid (CtA) + ZnCl$_2$ | 59.9 |

FIG. 5 and the results of Table 4 confirm that the light emitting layer included in the device of each of Examples 1 and 2 shows, e.g., exhibits, an increased current at a relatively low voltage of about 5 volts, which indicates that the light emitting layer exhibits an improved HT (hole transporting) characteristic.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent device comprising
a first electrode;
a second electrode;
a light emitting layer disposed between the first electrode and the second electrode;
an electron transport layer disposed between the light emitting layer and the second electrode; and
a polycarboxylic acid compound and a halogen at an interface between the electron transport layer and the light emitting layer,
wherein the light emitting layer comprises a plurality of semiconductor nanoparticles,
wherein the electron transport layer comprises a plurality of zinc oxide nanoparticles, and
wherein the polycarboxylic acid compound is a compound having 2 to 10 carboxylic acid groups.

2. The electroluminescent device of claim 1, wherein the electroluminescent device is configured to emit blue light, green light, or red light.

3. The electroluminescent device of claim 1, wherein the plurality of semiconductor nanoparticles does not comprise cadmium, lead, mercury, or a combination thereof.

4. The electroluminescent device of claim 1, wherein the electron transport layer is adjacent to the light emitting layer.

5. The electroluminescent device of claim 1, wherein the polycarboxylic acid compound has a carbon number of greater than or equal to about 2 and less than or equal to about 15, and
wherein an acid dissociation constant of the polycarboxylic acid compound is greater than or equal to about 2 and less than or equal to about 10.

6. The electroluminescent device of claim 1, wherein the polycarboxylic acid compound comprises succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof.

7. The electroluminescent device of claim 1, wherein the halogen comprises fluorine, chlorine, bromine, iodine, a combination thereof.

8. The electroluminescent device of claim 1, wherein the halogen is present in a form of a metal halide, an onium salt compound comprising a halogen, or a combination thereof.

9. The electroluminescent device of claim 1, wherein the zinc oxide nanoparticles comprise Zn$_{1-x}$M$_x$O, wherein, M is Mg, Ca, Zr, Co, W, Li, Ti, Y, Al, or a combination thereof, and $0 \leq x \leq 0.5$, and
wherein an average size of the zinc oxide nanoparticles is greater than or equal to about 1 nanometer and less than or equal to about 10 nanometers.

10. The electroluminescent device of claim 1, wherein the plurality of the semiconductor nanoparticles comprise zinc, and in the light emitting layer, a mole ratio of the halogen to zinc is greater than or equal to about 0.01:1 and less than or equal to about 0.5:1.

11. The electroluminescent device of claim 1, wherein the light emitting layer has a porosity of greater than or equal to about 0.01% and less than or equal to about 5%.

12. The electroluminescent device of claim 1, wherein the electroluminescent device has a maximum external quantum efficiency of greater than or equal to about 11% and
wherein a brightness of the electroluminescent device decreases to 90% of an initial brightness of the electroluminescent device after greater than or equal to about 7.6 hours.

13. A display device comprising the electroluminescent device of claim 1.

14. The display device of claim 13, wherein the display device comprises a handheld terminal, a monitor, a notebook computer, a television, an electronic display board, a camera, or a part for an automatic vehicle.

15. A method of producing the electroluminescent device of claim 1, which comprises:
forming the light emitting layer on the first electrode,
applying a treating solution on the light emitting layer, wherein the treating solution comprises the polycarboxylic acid compound and the halogen in a first organic solvent,
heat-treating the light emitting layer to which the treating solution has been applied at a temperature of greater than or equal to about 80° C. and less than or equal to about 250° C., and
forming the electron transport layer on the heat-treated light emitting layer to produce the electroluminescent device.

16. The method of claim 15, wherein the first organic solvent, the second organic solvent, or a combination thereof comprises a C$_{1-10}$ alcohol solvent, a C$_{2-20}$ nitrile solvent, a C$_{3-50}$ ester solvent, or a combination thereof,
wherein the polycarboxylic acid compound comprises a C2 to C15 polycarboxylic acid compound having 2 to 10 carboxylic acid groups, and
wherein the halogen compound comprises a metal halide, an onium salt compound, or a combination thereof.

17. The method of claim 15, wherein the polycarboxylic acid compound comprises succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof, and
wherein the halogen compound comprises a zinc halide, a trialkyl oxonium tetrafluoroborate, or a combination thereof.

18. An electroluminescent device comprising a first electrode;

a second electrode;

a light emitting layer disposed between the first electrode and the second electrode;

an electron transport layer disposed between the light emitting layer and the second electrode; and a halogen and a polycarboxylic acid at a surface of the light emitting layer facing the electron transport layer, wherein the electroluminescent device is configured to emit blue light, wherein the light emitting layer comprises a plurality of semiconductor nanoparticles, and the plurality of semiconductor nanoparticles comprises zinc, selenium, and sulfur, wherein the electron transport layer comprises a plurality of zinc oxide nanoparticles, wherein in the light emitting layer, a mole ratio of halogen to zinc is greater than or equal to about 0.01:1 and less than or equal to about 0.5:1, and wherein the polycarboxylic acid compound is a compound having 2 to 10 carboxylic acid groups.

19. The electroluminescent device of claim 18, wherein the light emitting layer exhibits a porosity of greater than or equal to about 0.01% and less than or equal to about 5%.

20. The electroluminescent device of claim 19, wherein the polycarboxylic acid compound comprises succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, an alginic acid compound, a poly(meth)acrylic acid compound, or a combination thereof.

\* \* \* \* \*